United States Patent
Clark (10) Patent No.: US 9,269,897 B2
(45) Date of Patent: Feb. 23, 2016

(54) DEVICE STRUCTURE FOR A RRAM AND METHOD

(71) Applicant: Crossbar, Inc., Santa Clara, CA (US)

(72) Inventor: Mark Harold Clark, Santa Clara, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 14/310,113

(22) Filed: Jun. 20, 2014

(65) Prior Publication Data

US 2014/0312297 A1  Oct. 23, 2014

Related U.S. Application Data

(62) Division of application No. 13/598,550, filed on Aug. 29, 2012, now Pat. No. 8,796,102.

(51) Int. Cl.
*H01L 47/00* (2006.01)
*H01L 45/00* (2006.01)
*H01L 27/24* (2006.01)

(52) U.S. Cl.
CPC ........ *H01L 45/1253* (2013.01); *H01L 27/2409* (2013.01); *H01L 45/08* (2013.01); *H01L 45/085* (2013.01); *H01L 45/1233* (2013.01); *H01L 45/145* (2013.01); *H01L 45/148* (2013.01); *H01L 45/16* (2013.01); *H01L 45/1675* (2013.01)

(58) Field of Classification Search
CPC .................................................. H01L 45/1253
USPC .......................................... 257/2–4; 438/382
See application file for complete search history.

(56) References Cited

U.S. PATENT DOCUMENTS

| 5,707,487 A | 1/1998 | Hori et al. |
| 6,939,787 B2 | 9/2005 | Ohtake et al. |
| 7,023,093 B2 | 4/2006 | Canaperi et al. |
| 7,238,607 B2 | 7/2007 | Dunton et al. |

(Continued)

FOREIGN PATENT DOCUMENTS

KR   10-2011-0014248 A   2/2011

OTHER PUBLICATIONS

Office Action for U.S. Appl. No. 12/814,410, dated Apr. 17, 2012.

(Continued)

*Primary Examiner* — Theresa T Doan
(74) *Attorney, Agent, or Firm* — Amin, Turocy & Watson, LLP (57) ABSTRACT

A method of forming a resistive device includes forming a first wiring layer overlying a first dielectric on top of a substrate, forming a junction material, patterning the first wiring layer and junction material to expose a portion of the first dielectric, forming a second dielectric over the patterned first wiring layer, forming an opening in the second dielectric to expose a portion of the junction material, forming a resistive switching material over the portion of the junction material in the opening, the resistive switching material having an intrinsic semiconductor characteristic, forming a conductive material over the resistive switching material, etching the conductive material and the resistive switching material to expose respective sidewalls of the resistive switching material and the conductive material, and the second dielectric, and forming a second wiring layer over the conductive material in contact with the respective sidewalls and the second dielectric.

30 Claims, 5 Drawing Sheets

(56) References Cited

U.S. PATENT DOCUMENTS

| | | | |
|---|---|---|---|
| 7,474,000 | B2 | 1/2009 | Scheuerlein et al. |
| 7,550,380 | B2 | 6/2009 | Elkins et al. |
| 7,786,589 | B2 | 8/2010 | Matsunaga et al. |
| 7,824,956 | B2 | 11/2010 | Schricker et al. |
| 7,829,875 | B2 | 11/2010 | Scheuerlein |
| 7,858,460 | B2 * | 12/2010 | Ring et al. ............. 438/197 |
| 7,858,468 | B2 | 12/2010 | Liu et al. |
| 7,968,419 | B2 | 6/2011 | Li et al. |
| 8,088,688 | B1 | 1/2012 | Herner |
| 8,097,874 | B2 | 1/2012 | Venkatasamy et al. |
| 8,389,971 | B2 | 3/2013 | Chen et al. |
| 8,399,307 | B2 | 3/2013 | Herner |
| 2003/0052330 | A1 | 3/2003 | Klein |
| 2004/0192006 | A1 | 9/2004 | Campbell et al. |
| 2004/0194340 | A1 | 10/2004 | Kobayashi |
| 2007/0087508 | A1 | 4/2007 | Herner |
| 2007/0105390 | A1 | 5/2007 | Oh |
| 2008/0185567 | A1 | 8/2008 | Kumar et al. |
| 2009/0001345 | A1 * | 1/2009 | Schricker et al. ............. 257/4 |
| 2009/0134432 | A1 | 5/2009 | Tabata et al. |
| 2009/0256130 | A1 * | 10/2009 | Schricker ............. 257/4 |
| 2010/0012914 | A1 | 1/2010 | Xu et al. |
| 2010/0019310 | A1 | 1/2010 | Sakamoto |
| 2010/0084625 | A1 | 4/2010 | Wicker et al. |
| 2010/0085798 | A1 | 4/2010 | Lu et al. |
| 2010/0090192 | A1 | 4/2010 | Goux et al. |
| 2010/0101290 | A1 | 4/2010 | Bertolotto |
| 2010/0102290 | A1 | 4/2010 | Lu et al. |
| 2010/0157710 | A1 | 6/2010 | Lambertson et al. |
| 2011/0068373 | A1 | 3/2011 | Minemura et al. |
| 2011/0133149 | A1 | 6/2011 | Sonehara |
| 2011/0284814 | A1 | 11/2011 | Zhang |
| 2011/0312151 | A1 | 12/2011 | Herner |
| 2012/0001145 | A1 | 1/2012 | Magistretti et al. |
| 2012/0008366 | A1 | 1/2012 | Lu |
| 2012/0012806 | A1 | 1/2012 | Herner |
| 2012/0012808 | A1 | 1/2012 | Herner |
| 2012/0015506 | A1 | 1/2012 | Jo et al. |
| 2012/0025161 | A1 | 2/2012 | Rathor et al. |
| 2012/0033479 | A1 | 2/2012 | Delucca et al. |
| 2012/0043654 | A1 | 2/2012 | Lu et al. |
| 2012/0074374 | A1 | 3/2012 | Jo |
| 2012/0074507 | A1 | 3/2012 | Jo et al. |
| 2012/0250183 | A1 | 10/2012 | Tamaoka et al. |
| 2012/0252183 | A1 | 10/2012 | Herner |
| 2013/0264535 | A1 | 10/2013 | Sonehara |

OTHER PUBLICATIONS

Office Action for U.S. Appl. No. 12/835,699, dated Aug. 24, 2011.
Notice of Allowance for U.S. Appl. No. 12/835,699, dated Feb. 6, 2012.
Office Action for U.S. Appl. No. 12/833,898, dated Apr. 5, 2012.
European Search Report for Application No. EP 1100 5207.3, dated Oct. 12, 2011.
Notice of Allowance for U.S. Appl. No. 12/833,898, dated May 30, 2012.
Notice of Allowance for U.S. Appl. No. 12/939,824, dated May 11, 2012.
Office Action for U.S. Appl. No. 12/913,719, dated Feb. 17, 2011.
Office Action for U.S. Appl. No. 12/913,719, dated Jul. 22, 2011.
Notice of Allowance for U.S. Appl. No. 12/913,719, dated Mar. 12, 2012.
Notice of Allowance for U.S. Appl. No. 12/940,920, dated Oct. 5, 2011.
Office Action for U.S. Appl. No. 13/314,513, dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653, dated Apr. 25, 2012.
International Search Report for PCT/US2011/045124, filed on Jul. 22, 2011.
Written Opinion of the international Searching Authority for PCT/US2011/045124, filed on Jul. 22, 2011.
Peng-Heng Chang et al., "Aluminum spiking at contact windows in Al/Ti-W/Si", Appl. Phys. Lett., Jan. 25, 1988, pp. 272-274, vol. 52 No. 4, American Institute of Physics.
J. Del Alamo et al., "Operating limits of Al-alloyed high-low junction for BSF solar cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, pp. 1-4, National Renewable Energy Laboratory, San Diego, California.
Notice of Allowance for U.S. Appl. No. 12/939,824, dated Jul. 24, 2012.
Notice of Allowance for U.S. Appl. No. 13/532,019, dated Nov. 14, 2012.
Office Action for U.S. Appl. No. 13/564,639, dated Mar. 19, 2013.
John S. Suehle et al., "Temperature dependence of soft breakdown and wear-out in Sub-3 nm $SiO_2$ films", 38th Annual International Reliability Physics Symposium, 2000, pp. 33-39, San Jose, California.
Woonki Shin et al., "Effect of Native Oxide on Polycrystalline Silicon CMP", Journal of the Korean Physical Society, Mar. 2009, pp. 1077-1081, vol. 54, No. 3.
Office Action for U.S. Appl. No. 13/447,036, dated Jul. 9, 2013.
Office Action for U.S. Appl. No. 13/764,698, dated Jul. 11, 2013.
Office Action for U.S. Appl. No. 13/481,600, dated Sep. 20, 2013.
Office Action for U.S. Appl. No. 13/564,639, dated Dec. 6, 2013.
Office Action for U.S. Appl. No. 13/764,698, dated May 21, 2014.

* cited by examiner

DEVICE STRUCTURE FOR A RRAM AND METHOD

This application claims priority to and is a divisional of U.S. application Ser. No. 13/598,550 filed Aug. 29, 2012, which is hereby incorporated by reference for all purposes.

BACKGROUND

The inventor of the present invention has recognized the success of semiconductor devices has been mainly driven by an intensive transistor down-scaling process. However, as field effect transistors (FETs) approach sizes less than 100 nm, physical problems such as short channel effect begin to hinder proper device operation. For transistor based memories, such as those commonly known as Flash memories, other performance degradations or problems may occur as device sizes shrink. With Flash memories, a high voltage is usually required for programming of such memories, however, as device sizes shrink, the high programming voltage can result in dielectric breakdown and other problems. Similar problems can occur with other types of non-volatile memory devices other than Flash memories.

The inventor of the present invention recognizes that many other types of non-volatile random access memory (RAM) devices have been explored as next generation memory devices, such as: ferroelectric RAM (Fe RAM); magneto-resistive RAM (MRAM); organic RAM (ORAM); phase change RAM (PCRAM); and others.

A common drawback with these memory devices include that they often require new materials that are incompatible with typical CMOS manufacturing. As an example of this, Organic RAM or ORAM requires organic chemicals that are currently incompatible with large volume silicon-based fabrication techniques and foundries. As another example of this, Fe-RAM and MRAM devices typically require materials using a high temperature anneal step, and thus such devices cannot be normally be incorporated with large volume silicon-based fabrication techniques.

Additional drawbacks with these devices include that such memory cells often lack one or more key attributes required of non-volatile memories. As an example of this, Fe-RAM and MRAM devices typically have fast switching (e.g. "0" to "1") characteristics and good programming endurance, however, such memory cells are difficult to scale to small sizes. In another example of this, for ORAM devices reliability of such memories is often poor. As yet another example of this, switching of PCRAM devices typically includes Joules heating and undesirably require high power consumption.

From the above, improved semiconductor memory devices that can scale to smaller dimensions with reduced drawbacks are therefore desirable.

BRIEF SUMMARY OF THE PRESENT INVENTION

The present invention is directed to resistive switching devices. More particularly, embodiments according to the present invention provide device structures and methods for resistive switching devices. Embodiments of resistive switching devices can be applied in non-volatile memory devices, but it should be recognized that embodiments can be applied to a much broader range of memories, processors, devices, or the like.

In a specific embodiment, a method of forming a resistive device for a non-volatile memory device is provided. The method includes providing a substrate having a surface region and forming a first dielectric material overlying the surface region of the substrate. A first wiring material is formed overlying the first dielectric material and a junction material comprising a p+ polycrystalline silicon material or p-doped silicon germanium material is formed overlying the first wiring material. In a specific embodiment, the method subjects the first wiring material and the junction material to a first pattern and etch process to form one or more bottom wiring structures and to expose a portion of the first dielectric material. The one or more bottom wiring structures includes the first wiring material and the junction material.

Embodiments also include forming a second dielectric material overlying the one or more bottom wiring structure, and then forming an opening structure in a portion of the second dielectric material to expose a portion of the junction material. A resistive switching material is formed overlying at least the junction material in the opening structure. The resistive switching material can include an amorphous silicon material having an intrinsic semiconductor characteristic in certain embodiments.

In specific embodiments, the method includes forming a conductive material overlying and adjacent to the resistive switching material (in physical and electric contact therewith). In a specific embodiment, the method includes removing concurrently a portion of the conductive material and the resistive switching material to expose a portion of second dielectric material surface while maintaining the conductive material and the resistive switching material in the opening structure in physical contact and electric contact with the junction material.

In some embodiments, a second wiring structure is formed overlying the conductive material in the first opening structure and overlying the exposed second dielectric material. The conductive material, the resistive switching material and the junction material form a resistive switching device in some specific embodiments.

In a specific embodiment, a resistive switching device for a non-volatile memory device is provided. The device includes a top electrode, a bottom electrode and a resistive switching material configured in an intersection region of the top electrode and the bottom electrode. In a specific embodiment, the top electrode has a portion that includes an active metal material in physical and electric contact with the resistive switching material. The bottom electrode includes a junction material formed from a p+ silicon material (for example, a p+ polycrystalline silicon material, a p+ polycrystalline silicon germanium material, or a combination).

In various embodiments, the resistive switching material includes a silicon material having an intrinsic semiconductor characteristic. Depending on the embodiment, the resistive switching material can be an amorphous silicon material or a polycrystalline silicon material, each having an intrinsic semiconductor characteristic.

In operation, the active metal material is configured to form a metal region including a filament structure in a portion of the resistive switching material upon application of an electric field to cause an electric resistance change of the resistive switching material. For example, a positive voltage applied to the top electrode with respect to the bottom electrode would cause the resistive switching device to be in a low resistance state or a high bit state upon programming. A negative voltage applied to the top electrode after programming would cause the resistive switching device to be in a high resistance state or having a low bit value.

According to one aspect of the invention, a method of forming a resistive device for a non-volatile memory device is disclosed. One method includes providing a substrate having a surface region, forming a first dielectric material overlying the surface region of the substrate, and forming a first wiring material overlying the first dielectric material. A technique includes forming a junction material comprising a p-doped silicon-bearing material overlying the first wiring material, subjecting the first wiring material and the junction material to a first pattern and etch process to form one or more bottom wiring structures and expose a portion of the first dielectric material, the one or more bottom wiring structures comprising the first wiring material and the junction material, and forming a second dielectric material overlying the one or more bottom wiring structure. A process includes forming an opening structure in a portion of the second dielectric material to expose a portion of the junction material, forming a resistive switching material comprising an amorphous silicon-bearing material overlying at least the portion of the junction material in the opening structure, the amorphous silicon-bearing material having an intrinsic semiconductor characteristic, and forming a conductive material overlying the resistive switching material, the conductive material being in physical contact and electric contact with the resistive switching material. A method includes removing concurrently a portion of the conductive material and a portion of the resistive switching material to expose a portion of second dielectric material, sidewalls of the conductive material and sidewalls of the resistive switching material, while maintaining conductive material and resistive switching material in the opening structure in physical contact and electric contact with the junction material, and forming a second wiring structure overlying the conductive material in the opening structure and overlying the portion of the second dielectric material.

According to another aspect of the invention, a resistive switching device for a non-volatile memory device is disclosed. A device includes a substrate having a surface region, a first dielectric material overlying the surface region of the substrate, and a first wiring material overlying the first dielectric material. A memory includes a junction material comprising a p-doped silicon-bearing material overlying the first wiring material, one or more bottom wiring structures comprising the first wiring material and the junction material, and a second dielectric material overlying the one or more bottom wiring structures. A device includes a plurality of stacks of material comprising a conductive material and a resistive switching material disposed within an opening structure of the second dielectric material, wherein the resistive switching material is in contact with a portion of the junction material, wherein the resistive switching material comprises an amorphous silicon-bearing material having an intrinsic semiconductor characteristic, and wherein the conductive material and the resistive switching material include respective sidewalls, and a second wiring material overlying the plurality of stacks of material and the second dielectric material, wherein the second wiring material contacts the sidewalls of the conductive material, the sidewalls of the resistive switching material and the second dielectric material.

Many benefits can be achieved by ways of the present invention over conventional techniques. Some embodiments according to the present invention provide a method to form a resistive switching device free from contamination or with reduced contamination that cause undesirable electric connection between electrodes (or shorts). Additionally, various embodiments can be carried out using conventional processing equipment without modification. Depending on the embodiments, one or more of these benefits may be achieved. One skilled in the art would recognize other variations, modifications, and alternatives.

SUMMARY OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE PRESENT INVENTION

The present invention is directed to resistive switching device. More particularly, embodiments according to the present invention provide a device structure and a method to form a resistive switching device. The resistive switching device has been applied in non-volatile memory device. But it should be recognized that embodiment according to the present invention can have a much broader range of applicability.

Switching devices is generally based on a state change characteristic of a non-conducting material in the presence of an electric field. Silicon based switching devices have a material compatibility advantage over other switching devices using materials such as metal oxides in fabrication. However, conventional metal/Si/metal (M/Si/M) type devices require a high operating voltage (usually greater than about 10V)

which is not fully controllable and thus reduces the device yield and endurance. Such devices may not be able to further scale down to nanometer scale as required by present application in consumer electronics. Moreover, contaminations and process complexity adversely affect yield and performance of the device. Embodiments according to the present invention provide a method and a resulting device structure for a resistive switching device having a desirable switching characteristic and device reliability.

The terms "top" and "bottom" are for purpose of illustration only, and should not be construed to be limiting.

The present invention is generally related to resistive switching devices. More particularly, embodiments according to the present invention provide a device structure and a method to improve device performance of a resistive switching device The present invention can be applied to improving data retention characteristic of non-volatile memory devices, but it should be recognized that embodiments according to the present invention can have a much broader range of applicability.

Some embodiments of a resistive switching device include a two terminal device including a top electrode, a bottom electrode and a resistive switching material disposed between the top electrode and the bottom electrode. The resistive switching material is characterized by a resistance dependent on an electric field upon an application of a suitable voltage to one of the electrodes. The electric field causes a conductor path to form in the resistive switching material. Depending on the electrode material and the resistive switching material used, the conductor path can be formed from the electrode material or defect path in the presence of the electric field. The conductor path determines the resistance of the resistive switching material. For example, for a metal oxide material as the switching material, the conductor path can form from oxygen deficient sites in the metal oxide. For a silicon material as the switching material, the conductor path can be formed from the electrode material, which comprises an active metal material. The resistive switching material is in a high conductance state. The conductor path is broken or retracts when a reverse bias voltage is applied and causes the resistive switching material to be in a low conductance state. The resistance of the resistive switching material has a resistance depending on the voltage and provide for a multi-level or multi-bit device. Therefore the conductor path structure needs to be stable under selected voltage, forward bias voltage, or reverse bias voltage for proper data retention.

Embodiments according to the present invention provide a device structure and a method for a resistive switching device characterized by a stable conductive path when a pre-determined voltage is applied and a reliable data retention characteristic for the device.

Figure 1:
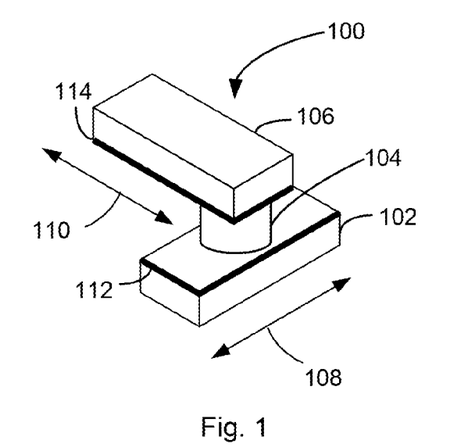
FIG. 1 is a simplified diagram illustrating a resistive switching device according to an embodiment of the present invention.
Figure 2:
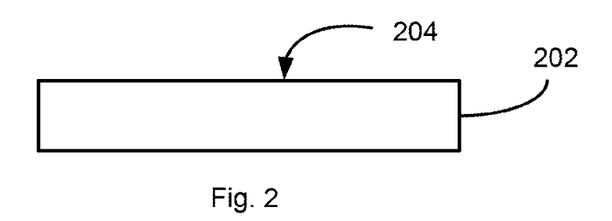
FIG. 2 is a simplified diagram illustrating a resistive switching device according to an embodiment of the present invention.

FIG. 1 is a simplified diagram illustrating a resistive switching device 100 according to an embodiment of the present invention. The resistive switching device includes a first electrode 102, a second electrode 106, and a resistive switching material 104 sandwiched between the first electrode and the second electrode.

In various embodiments, resistive switching device 100 is formed upon a semiconductor substrate (not shown). In certain embodiments, the semiconductor substrate can have one or more MOS devices formed thereon. The one or more MOS devices can be controlling circuitry for the resistive memory devices in specific embodiments. In other embodiments, the one or more MOS devices may include other functionality, such as a processor, logic, or the like.

In various embodiments, a processor, or the like, may include resistive memory memories as described herein. Because the resistive state-change memories are relatively non-volatile, the states of devices, such as processors, or the like may be maintained while power is not supplied to the processors. To a user, such capability would greatly enhance the power-on power-off performance of devices including such processors. Additionally, such capability would greatly reduce the power consumption of devices including such processors. In particular, because such resistive memories are non-volatile, the processor need not draw power to refresh the memory states, as is common with CMOS type memories. Accordingly, embodiments of the present invention are directed towards processors or other logic incorporating these memory devices, as described herein, devices (e.g. smart phones, network devices) incorporating such memory devices, and the like.

In some embodiments, the first electrode 102 can be a first conductor material. The first electrode 102 can include a first conductive material such as a first metal material and a doped semiconductor material 112. In a specific embodiment, the first metal material 102 can be tungsten, aluminum, copper or other suitable metal that are compatible with CMOS fabrication techniques. In additional embodiments, a doped semiconductor material 112 may be p-doped polysilicon, p-doped silicon germanium, or the like. In a specific embodiment, the first electrode is elongated in shape and configured to extend in a first direction 108.

The resistive switching material 104 can include a suitable insulator material having a resistance that can be altered upon application of an electric field to the insulator material. In a specific embodiment, the resistive switching material 104 can include a silicon material. For example, the silicon material can be an amorphous silicon material, a microcrystalline silicon material, a macro crystalline silicon material, a silicon germanium material including any combination of these. In some embodiments, the silicon material includes an amorphous silicon material, a silicon oxide, or the like.

The resistive switching material 104 is characterized by a state, for example, a resistance state dependent on an electric field in the switching material. In a specific embodiment, the switching material is an amorphous silicon material. The amorphous silicon material has essentially intrinsic semiconductor characteristic and is not intentionally doped in a specific embodiment. In various embodiments, the amorphous silicon is also referred to as non-crystalline silicon (nc-Si). nc-Si non-volatile resistive switching devices may be fabricated using existing CMOS technologies. In an exemplary process, a mixture of silane (SiH4) (45 sccm) and Helium (He) (500 sccm) is used to form an a-Si layer with a deposition rate of 80 nm per minute (T=260° C., P=600 mTorr) during PECVD. In another exemplary process, a mixture of silane (SiH4) (190 sccm) and Helium (He) (100 sccm) is used to form an a-Si layer with a deposition rate of 2.8 A per second (T=380° C., P=2.2 Torr) during PECVD. In another exemplary process, silane (SiH4 80 sccm) or disilane is used to form an a-Si layer with a deposition rate of 2.8 nm per minute (T=585° C., P=100 mTorr) during LPCVD. Portions of polysilicon grains may form during the LPCVD process and result in an amorphous-poly silicon film. In various embodiments, no p-type, n-type, or metallic impurities are intentionally added to the deposition chamber while forming the amorphous silicon material. Accordingly, when deposited, the amorphous silicon material is substantially free of any p-type, n-type or metallic dopants, i.e. the amorphous silicon material is undoped.

In yet another embodiment, the resistive switching material/amorphous silicon material 104 may be formed from an upper region of a p+ polycrystalline silicon or p+ silicon germanium bearing layer (e.g. 112) using an Argon, Silicon, Oxygen plasma etch, or the like. For instance, a plasma etch may use a bias power within a range of approximately 30 watts to approximately 120 watts to convert an upper region of the polysilicon or silicon germanium material into a non-conductive amorphous silicon having p-type impurities (from the original polycrystalline silicon or silicon germanium bearing layer 112).

The second electrode 106 can be a second conductor material and can have a portion that includes a second metal material. The second metal material can be selected from aluminum, nickel, silver, gold, palladium, platinum, and others. The second metal material may have a suitable diffusivity in the switching material in a specific embodiment. In a specific embodiment, the second electrode is elongated in shape and configured to extend in a second direction 110 orthogonal to the first direction 108. In a specific embodiment, the second metal material includes a silver material.

As mentioned above, in certain embodiments, the resistive switching device 100 can include a contact material (112) disposed between the metal material of the first electrode 102 and the amorphous silicon material 104. In some embodiments, the contact material 112 provides a suitable interfacial defect characteristic for desirable switching behavior for the switching device 100. For amorphous silicon material as the switching material 104, the contact material 112 can be p+ polysilicon or p+ silicon germanium material. In certain embodiments, the contact material 112 can be optional.

In some embodiments, additional interposing layer(s) 114 may be disposed between resistive switching material 104 and second electrode 106. The additional layer 114 may include a material that has non-noble metal properties, e.g. the material oxidizes in the presence of oxygen. In some examples, the additional layer 114 may be titanium, titanium nitride, tungsten, tungsten nitride, or the like. In various embodiments, additional layer 114 may serve as an adhesion and/or barrier layer between resistive switching material 104 and second electrode 106.

In various embodiments, multiple resistive switching devices 100 can be disposed in an N by M crossbar array to form a high density interconnected array of non-volatile memory cells.

FIGS. 2-13 illustrate a method of forming a resistive switching device for a memory device according to various embodiments of the present invention. As shown in FIG. 1, a semiconductor substrate 202 having a surface region 204 is provided. Semiconductor substrate 202 can be a single crystal silicon wafer, a silicon germanium material, a silicon on insulator (commonly called SOI) depending on the embodiment. In certain embodiments, semiconductor substrate 202 can have one or more MOS devices formed thereon or therein. The one or more MOS devices can be controlling circuitry for the resistive switching device, or the like in some embodiments.

Figure 3:
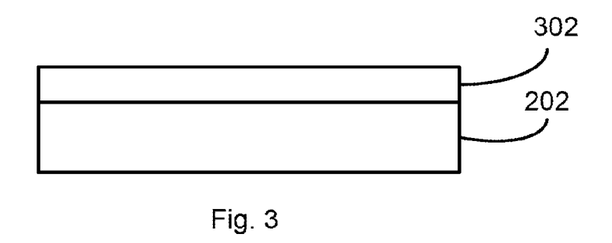
FIG. 3 is a simplified diagram illustrating a resistive switching device according to an embodiment of the present invention.

As illustrated in FIG. 3, embodiments of the method include depositing a first dielectric material 302 overlying the semiconductor substrate 202. First dielectric material 302 can be silicon oxide, silicon nitride, a dielectric stack of alternating layers of silicon oxide and silicon nitride (for example, an ONO stack), a low K dielectric, a high K dielectric, or a combination, and others, depending on the application. First dielectric material 302 can be deposited using techniques such as chemical vapor deposition, including low pressure chemical vapor deposition, plasma enhanced chemical vapor deposition, high density plasma chemical vapor deposition, atomic layer deposition (ALD), physical vapor deposition, including any combination of these, and others.

Figure 4:
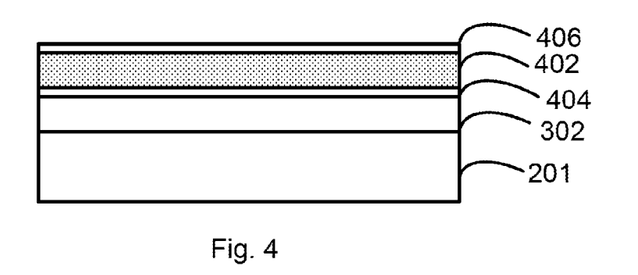
FIG. 4 is a simplified diagram illustrating a resistive switching device according to an embodiment of the present invention.

Referring to FIG. 4, embodiments of the method include depositing a first wiring material 402 overlying the first dielectric material. First wiring material 402 can be a suitable metal material including alloy materials, or a semiconductor material having a suitable conductivity characteristic. In some embodiments, the metal material can be tungsten, aluminum, copper or silver, and others. In some embodiments, the first wiring material may be a combination of conductive materials. In various embodiments, these metal materials may be deposited using a physical vapor deposition process, chemical vapor deposition process, electroplating, or electrodeless deposition process, a combinations of these, and others. In some embodiments, the semiconductor material can be, for example, a p-type doped silicon material, a conductive polysilicon, or the like.

In certain embodiments, a first adhesion material 404 is first formed overlying the first dielectric material 402 before deposition of the first wiring material 402 to promote adhesion of the first wiring material 402 to the first dielectric material 302. A diffusion barrier material 406 may also be formed overlying the first wiring material 402 to prevent, for example, the conductive material, the metal material, gasses, oxygen, or the like to contaminate other portions of the device in a specific embodiment.

Figure 5:
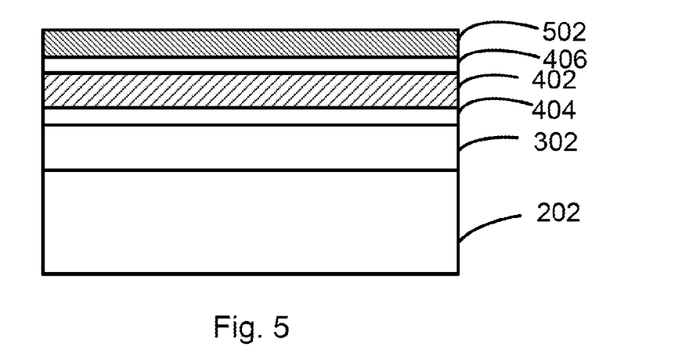
FIG. 5 is a simplified diagram illustrating a resistive switching device according to an embodiment of the present invention.

Referring to FIG. 5, the method includes forming a junction material 502 overlying at least the first wiring material 402 (or first diffusion barrier material 406, if used). First junction material 502 can be a p-doped silicon-bearing material (e.g. p++ polysilicon, p-doped silicon-germanium, or the like) in a specific embodiment. The p++ polysilicon material can be formed by using a deposition process such as a low pressure chemical vapor deposition process a plasma enhanced chemical vapor deposition process using silane ($SiH_4$) or disilane ($Si_2H_6$), or a suitable chlorosilane depending on the application. Alternatively, the first silicon material can be deposited using a physical vapor deposition process from a suitable silicon target. Deposition temperature can range from about 380 Degree Celsius to about 450 Degree Celsius, and preferably not higher than 440 Degree Celsius. In a specific embodiment, the p++ polysilicon material is deposited using a low pressure chemical vapor deposition process using disilane at a deposition temperature ranging from about 400 Degree Celsius to about 460 Degree Celsius.

Figure 6:
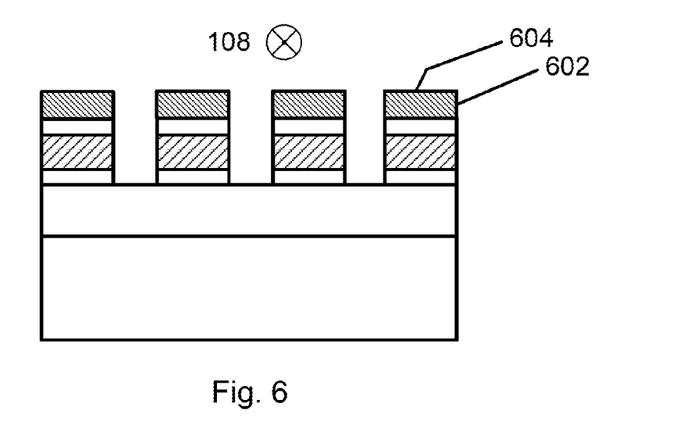
FIG. 6 is a simplified diagram illustrating a resistive switching device according to an embodiment of the present invention.

In FIG. 6, an embodiment of the method subjects first wiring material 402 (and junction material 502 to a first pattern and etch process to form a bottom wiring structure 602. The bottom wiring structure 602 includes a plurality of first elongated structures configured to extend in first direction 108 in a specific embodiment.

Figure 7:
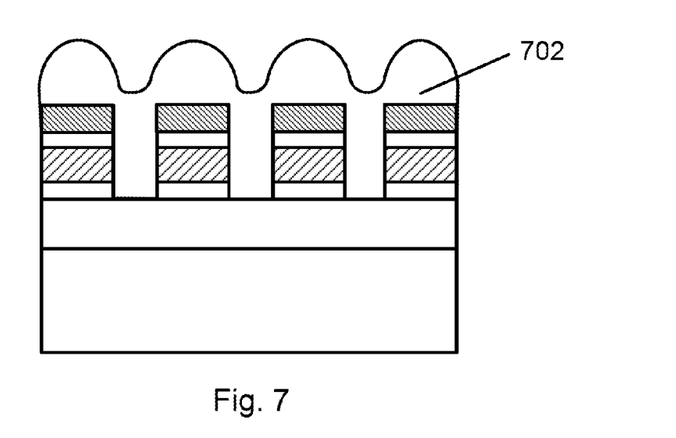
FIG. 7 is a simplified diagram illustrating a resistive switching device according to an embodiment of the present invention.

Next, as illustrated in FIG. 7, an embodiment deposits a second dielectric material 702 overlying the bottom wiring structure 602. In some embodiments, second dielectric material 702 contacts first dielectric material 302.

The second dielectric material 702 can be silicon oxide, silicon nitride, a dielectric stack of alternating layers of silicon oxide and silicon nitride (for example, an ONO stack), a low K dielectric, a high K dielectric, or a combination, and others, depending on the application.

In some embodiments, second dielectric material 702 may be subjected to a planarizing process form a planarized surface. The planarizing process can be a chemical mechanical polishing process or an etch back process, a combination thereof, and others depending on the application. In certain implementations, the planarizing steps may be omitted, as illustrated in FIG. 8.

Figure 8:
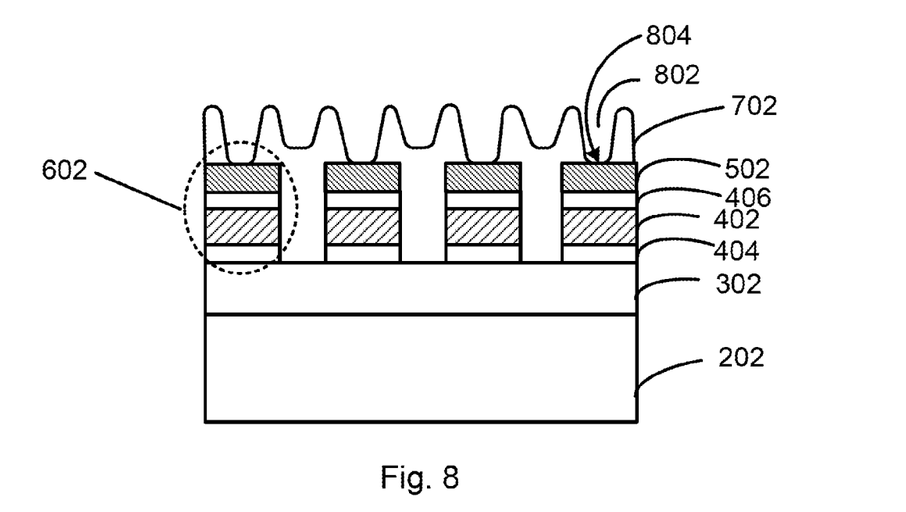
FIG. 8 is a simplified diagram illustrating a resistive switching device according to an embodiment of the present invention.

Referring to FIG. 8, second dielectric material 702 (not planarized) is subjected to a second pattern and etch process to form a first opening structure 802 in a portion of second dielectric material 702. In various embodiments, junction material 502 serves as an etch stop. As shown in FIG. 8, first opening structure 802 exposes a top surface region 804 of dielectric material 702 in the bottom wiring structure 602, as shown.

Figure 9:
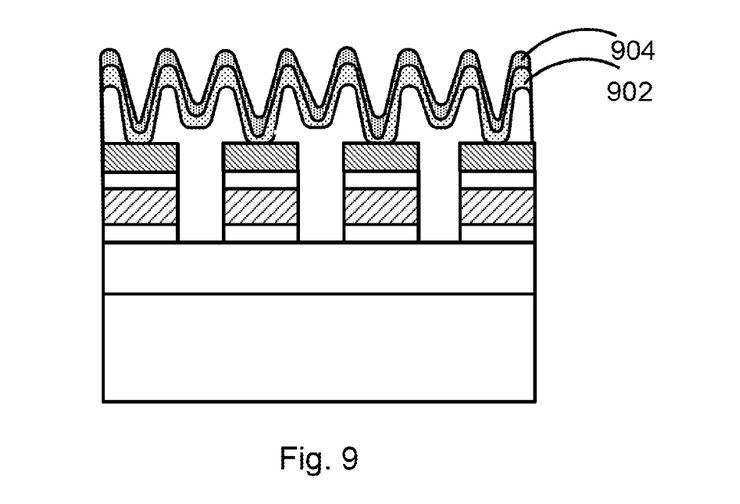
FIG. 9 is a simplified diagram illustrating a resistive switching device according to an embodiment of the present invention.

As shown in FIG. 9, various embodiments include depositing a resistive switching material 902 overlying the second dielectric material 702 and substantially conformal overlying the first opening structure 802. In a specific embodiment, the resistive switching material 902 is an amorphous silicon material having an intrinsic semiconductor characteristic.

In various embodiments, the resistive switching material 902 is characterized by a state, for example, a resistance state dependent on an electric field in the switching material. In a specific embodiment, the resistive switching material 902 is an amorphous silicon material. The amorphous silicon material has essentially intrinsic semiconductor characteristic and is not intentionally doped in a specific embodiment. In various embodiments, the amorphous silicon is also referred to as non-crystalline silicon (nc-Si). nc-Si non-volatile resistive switching devices may be fabricated using existing CMOS technologies. In an exemplary process, a mixture of silane (SiH4) (45 sccm) and Helium (He) (500 sccm) is used to form an a-Si layer with a deposition rate of 80 nm per minute (T=260° C., P=600 mTorr) during PECVD. In another exemplary process, a mixture of silane (SiH4) (190 sccm) and Helium (He) (100 sccm) is used to form an a-Si layer with a deposition rate of 2.8 A per second (T=380° C., P=2.2 Torr) during PECVD. In another exemplary process, silane (SiH4 80 sccm) or disilane is used to form an a-Si layer with a deposition rate of 2.8 nm per minute (T=585° C., P=100 mTorr) during LPCVD. Portions of poly-silicon grains may form during the LPCVD process and result in an amorphous-poly silicon film. In various embodiments, no p-type, n-type, or metallic impurities are intentionally added to the deposition chamber while forming the amorphous silicon material. Accordingly, when deposited, the amorphous silicon material is substantially free of any p-type, n-type or metallic dopants, i.e. the amorphous silicon material is undoped. In some embodiments, a thickness of the amorphous silicon-bearing material may be on the order of about 5 nm, within the range of about 3 nm to about 8 nm, within the range of about 1 nm to about 10 nm, or the like.

In yet another embodiment, the resistive switching material 902 (e.g. amorphous silicon material) may be formed from an upper region of junction material 502, via top surface region 804. In some examples, junction material 501 includes a p-doped silicon bearing material (e.g. polysilicon, silicon-germanium) that is amorphized by an Argon, Silicon, Oxygen plasma etch, or the like. For instance, a plasma etch may use a bias power within a range of approximately 30 watts to approximately 120 watts to convert an upper region of junction material 502 into a non-conductive amorphous silicon. Although this layer may have having p-type impurities (from the original polycrystalline silicon bearing layer), in the amorphized state, the impurities are not active, and the amorphized layer is intrinsic. Typical thickness ranges for such an amorphized layer is from about 2 nm to about 10 nm thick.

Referring again to FIG. 9, in various embodiments, the method includes depositing an active metal material 904 overlying the resistive switching material. For amorphous silicon material as the resistive switching material 902, active metal material 904 can be selected from silver, gold, palladium, platinum, aluminum, chromium, vanadium, and others. The active metal material 904 is selected to have a desirable diffusivity characteristic in the resistive switching material 902 in a presence of a suitable electric field.

In certain embodiments, the active metal material 904 is silver. In some embodiments, silver is deposited at a temperature no greater than about 250 Degree Celsius to inhibit mass diffusion of silver into the resistive switching material 902. In a specific embodiment, in operation of the fabricated device, when a positive voltage greater than a threshold voltage applied to the active metal material 904 with respect to the bottom wiring structure 602, the active metal material 904 (e.g. silver) migrates into a portion of the amorphous silicon material 902. This causes the amorphous silicon material 902 to be in a low resistance state (or on state) and causes an on-state current flow.

Figure 10:
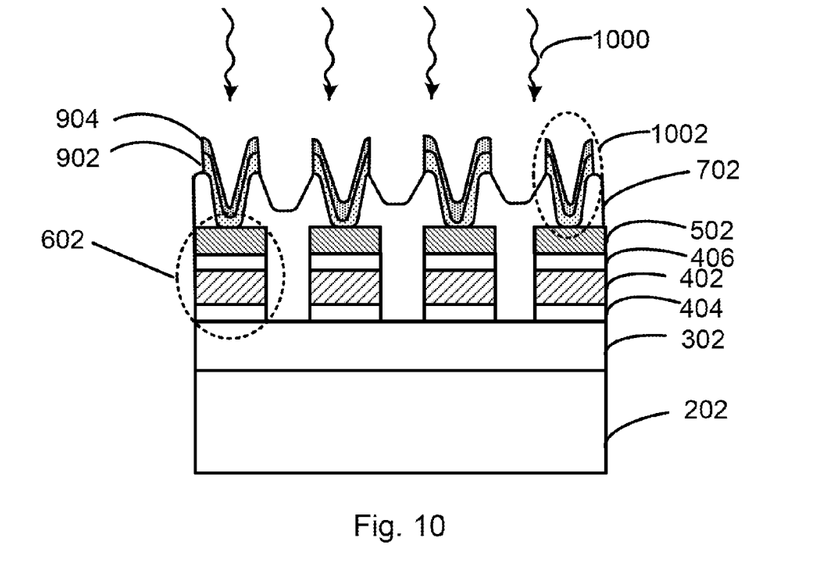
FIG. 10 is a simplified diagram illustrating a resistive switching device according to an embodiment of the present invention.

Referring now to FIG. 10. Resistive switching material 902 and active metal material 904 are subjected concurrently to a pattern and etch process 1000 to remove a first portion of the resistive switching material 904 and the active metal 902 from a surface region of the second dielectric material while a second portion 1002 of the resistive switching material and the active metal material are maintained in physical and electric contact with the first junction material 502. As illustrated in FIG. 10, by etching resistive switching material 904 and active metal 902 with the same etch process, and etching deeply into second dielectric material 702, pigtails, or other types of contaminants that may cause sidewall shorts are reduced from the exposed sidewalls of resistive switching material 904 and active metal 902.

In some embodiments, the resistive switching material in second portion 1002 provides a resistive switching region for a resistive switching device. The pattern and etch process 1000 can be a sputter etch using argon as an etchant material. Alternatively, a reactive ion etch may be used. In some embodiments, the second dielectric material 702 may have a thickness thick enough to maintain a certain thickness after etching process 1000 to electrically isolate each of the resistive switching devices, as illustrated.

Figure 11:
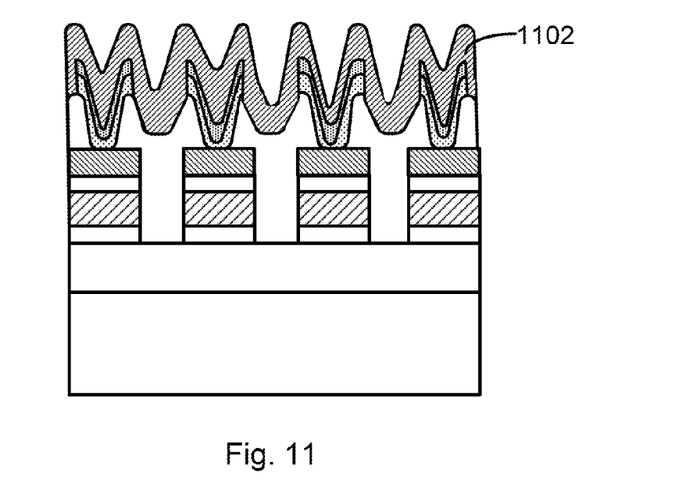
FIG. 11 is a simplified diagram illustrating a resistive switching device according to an embodiment of the present invention.

In some embodiments, the method includes forming a second wiring material 1102 overlying the active metal material 904 in the first opening structure and the exposed surface region of the second dielectric material 702 as illustrated in FIG. 11. The second wiring material 1102 can be copper, tungsten, or aluminum depending on the application. Depending on the implementation, the active metal material 1002 (for example, silver) may be used as the top wiring material. The second wiring material 1102 can further include one or more diffusion barrier layer and/or adhesion material disposed between second wiring material 1102 and active metal material 904 and/or disposed above second wiring material 1102. In various embodiments, an adhesion material promotes adhesion of the second wiring material to the second dielectric material and the active metal material; and one or more diffusion barrier material inhibits unintentional diffusion of the active metal material and/or inhibits oxygen from diffusing into other layers of the device. Depending on the implementation, the one or more diffusion barrier material can include titanium, titanium nitride, tungsten, titanium tungsten, or a combination thereof, and others.

Figure 12:
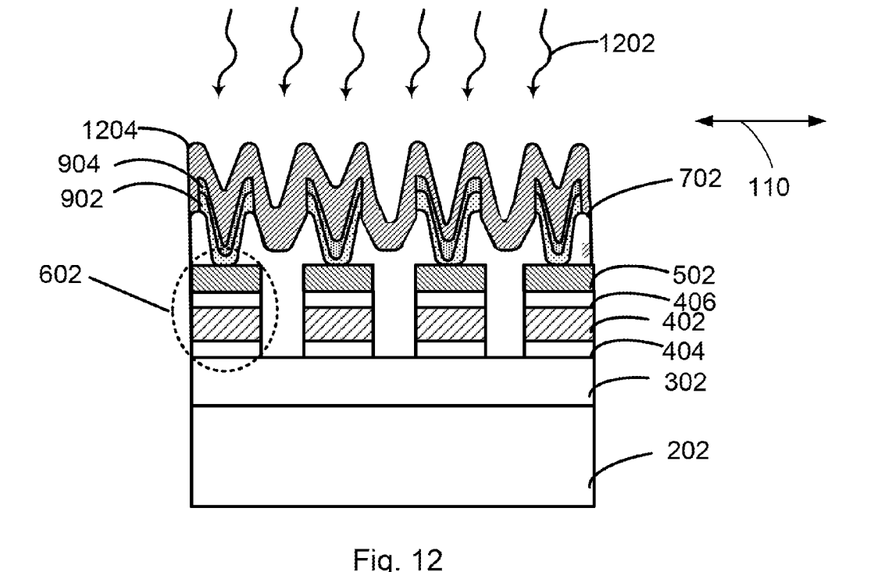
FIG. 12 is a simplified diagram illustrating a resistive switching device according to an embodiment of the present invention.

In the embodiments illustrated in FIG. 12, second wiring material 1102 including the one or more diffusion barrier material is subjected to a pattern and etch process 1202 to form a top wiring structure 1204 for the resistive switching device. In some embodiments, pattern and etch process 1202 is performed at temperatures no greater than about 250 Degree Celsius to inhibit mass diffusion of active conductive material (for example silver material) to diffuse into the resistive switching material (for example amorphous silicon material) due to thermal effect.

The second wiring structure 1204 is configured to be elongated in shape and extend to form wiring structures that extend in a second direction 110, perpendicular to the first direction 108 in a specific embodiment. The resistive switching material 902 is sandwiched in an intersection region formed the top wiring structure 1204 and the bottom wiring structure 602 providing for a high density interconnected device.

Depending on the application, second wiring material 1102 can be a semiconductor material having a suitable conductance. For example, the semiconductor material can include a suitably doped polysilicon material in a specific embodiment.

Figure 13:
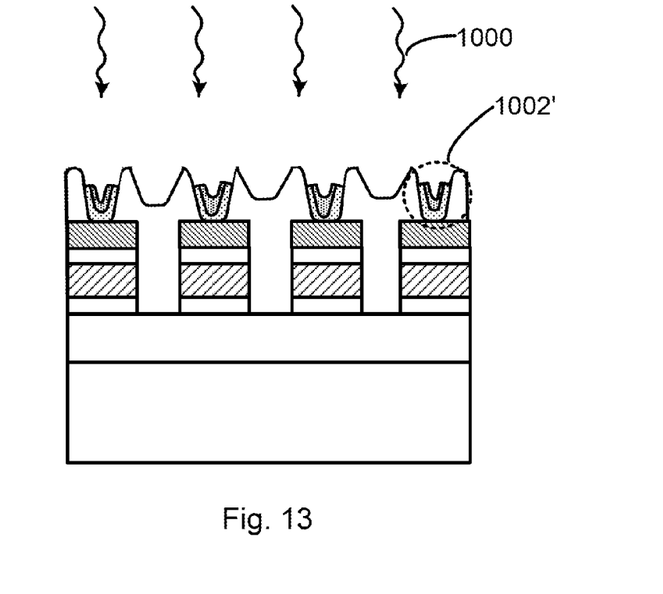
FIG. 13 is a simplified diagram illustrating a resistive switching device according to an embodiment of the present invention.

In some alternative embodiments, as illustrated in FIG. 13, pattern and etching process 1000 can remove substantially all the resistive switching material 902 and the active metal material 904 from the surface region of the second dielectric material 702 and partially from the first opening region while a second portion 1002' remains in the first opening structure. In some embodiments, the second portion including the resistive switching material 902 and the active metal material 904 maintains a physical and electrical contact with the junction material 502 in a specific embodiment. By merely changing a critical dimension (CD) of patterning and etching process 1000, either structure 1002 or 1002' may be achieved. The embodiments in FIGS. 11 and 13 provide for a resistive switching material side wall free from contamination from patterning and etching of the conductive material or wiring materials during fabrication.

As the resistive switching material 902 is formed in the first opening structure before pattern and etch, contamination due to etching may be formed on sidewall of the resistive switching material 902 and undesirable electrical connection between the bottom wiring structure 602 and the top wiring structure 1204 is thus inhibited. Device yield and device performance are thus enhanced.

In a specific embodiment, a resistive switching device structure for a non-volatile memory device is provided. The resistive switching device includes a substrate having a surface region and a first dielectric material overlying the surface region of the substrate. The substrate can be a single crystal silicon material, a silicon on insulator substrate (commonly known as SOI), or a silicon germanium material, and others, depending on the embodiment. In a specific embodiment, the substrate can have one or more transistor device formed thereon. The one or more transistor device can be controlling circuitry for the resistive switching device in a specific embodiment. The resistive switching device includes a first wiring material overlying the first dielectric material and a junction material comprising a p+ polycrystalline silicon material overlying the first wiring material. In a specific embodiment, the device structure includes one or more bottom wiring structures comprising the first wiring material and the junction material. The bottom wiring structure is elongated in shape and configured to extend in a first direction. The bottom wiring structures are isolated using a second dielectric material overlying the one or more bottom wiring structures. The resistive switching device includes a stack of material configured in an opening in a portion of the second dielectric material overlying the junction material in a specific embodiment. The stack of material includes a resistive switching material overlying a conductive material in a specific embodiment. The resistive switching material includes an amorphous silicon material having an intrinsic semiconductor characteristic in various implementations. The resistive switching device includes a second wiring structure overlying at least the conductive material in the first opening structure and overlying an exposed second dielectric material. The second wiring structure is configured to extend in a second direction at an angle to the first direction. In certain implementation, the angle is right angle.

Though the present invention has been exemplified in various embodiments, it is to be understood that the examples and embodiment described herein are for illustrative purpose only purposes only and that various modifications or alternatives in light thereof will be suggested to persons skilled in the art and are to be included within the spirit and purview of this application and scope of the appended claims.

What is claimed is:

1. A resistive switching device for a non-volatile memory device, comprising:
   a substrate having a surface region;
   a first dielectric material overlying the surface region of the substrate;
   a first wiring material overlying the first dielectric material;
   a junction material comprising a p-doped silicon-bearing material overlying the first wiring material;
   one or more bottom wiring structures comprising the first wiring material and the junction material;
   a second dielectric material overlying the one or more bottom wiring structures;
   a plurality of stacks of material comprising a conductive material and a resistive switching material disposed within an opening structure of the second dielectric material, wherein the resistive switching material is in contact with a portion of the junction material, wherein the resistive switching material comprises an amorphous silicon-bearing material having an intrinsic semiconductor characteristic, and wherein the conductive material and the resistive switching material include respective sidewalls;
   a second wiring material overlying the plurality of stacks of material and the second dielectric material, wherein the second wiring material contacts the sidewalls of the conductive material and of the resistive switching material, and contacts the second dielectric material.

2. The device of claim 1, wherein the substrate comprises one or more transistor devices formed thereon, the one or more transistor devices comprising a controlling circuitry for the non-volatile memory device.

3. The device of claim 1, wherein the conductive material is selected from a group consisting of: silver, tungsten, copper, gold, palladium, aluminum, platinum, copper, zinc, nickel, or a combination thereof.

4. The device of claim 1, wherein the second wiring material further comprises a diffusion barrier layer material or an adhesion material.

5. The device of claim 1, wherein the junction material is selected from a group consisting of: a p-doped polycrystalline silicon material, and a p-doped silicon germanium material.

6. The device of claim 1, wherein the amorphous silicon-bearing material having an intrinsic semiconductor characteristic is selected from a group consisting of a non-intentionally doped amorphous silicon material, and a silicon oxide.

7. The device of claim 6, wherein the amorphous silicon-bearing material has a thickness selected from a range of about 3 nm to about 8 nm.

8. The device of claim 1, wherein the junction material comprises an etch stop.

9. The device of claim 1 wherein the sidewall of the resistive switching material is substantially free from side wall contamination derived from the conductive material.

10. The device of claim 1, further comprising:
one or more top wiring structures comprising the second wiring material, wherein the one or more top wiring structures extend in a first direction;
wherein the one or more bottom wiring structures extend in a second direction; and
wherein the first direction and the second direction are substantially orthogonal.

11. The device of claim 1, wherein the conductive material is configured to form a filament structure in a portion of the resistive switching material in response to application of an electric field.

12. The device of claim 2, wherein the controlling circuitry comprises a processor.

13. The device of claim 1, wherein the conductive material is characterized by a diffusivity in the resistive switching material.

14. The device of claim 4, wherein the at least one of the diffusion barrier layer material or the adhesion material is selected from a group consisting of titanium, titanium nitride, tungsten, tungsten nitride, and a metal nitride.

15. The device of claim 1, wherein the second wiring material further comprises an oxygen diffusion barrier layer material.

16. The device of claim 1, wherein the plurality of stacks of material are disposed above portions of the second dielectric material; and
wherein the conductive material and the resistive switching material coextend over the portions of the second dielectric material.

17. The device of claim 6, wherein the amorphous silicon-bearing material has a thickness selected from a range of about 1 nm to about 10 nm.

18. The device of claim 1, wherein the amorphous silicon-bearing material comprises a silicon sub-oxide having a thickness selected from a range of about 3 nm to about 8 nm, and wherein the conductive material is selected from a group consisting of silver, a silver material, aluminum, and an aluminum material.

19. The device of claim 1, wherein the resistive switching material comprises a layer of an amorphized material having a thickness selected from a range of about 2 nm to about 10 nm.

20. The device of claim 19, wherein the layer of the amorphized material is intrinsic.

21. A semiconductor device, comprising:
a substrate having a surface region;
a first dielectric material overlying the surface region of the substrate;
a first plurality of wiring structures overlying the first dielectric material, wherein a first wiring structure from the first plurality of wiring structures is characterized by a first width;
a second dielectric material overlying the first plurality of wiring structures, wherein the second dielectric material having a plurality of vias, wherein the plurality of vias expose at least a portion of the first plurality of wiring structures, wherein a via from the plurality of vias is characterized by a second width, wherein the first width and the second width are different;
a plurality of stacks of material comprising an active metal material and a resistive switching material disposed within the plurality of vias in the second dielectric material, wherein the resistive switching material is in contact with the portion of the first plurality of wiring structures; and
a second plurality of wiring structures overlying the plurality of stacks of material and the second dielectric material, wherein he second plurality of wiring structures is coupled to the active metal material.

22. The device of claim 21 wherein the first wiring structure comprises:
a metal layer having a metal selected from a group consisting of: aluminum, aluminum alloy, copper, copper alloy, and a metallic alloy; and
a barrier layer having a material selected from a group consisting of: titanium-containing material, a metal nitride, tungsten-containing material, and titanium tungsten material; and
wherein the resistive switching material is in contact with the barrier layer.

23. The device of claim 22 wherein the first width is greater than the second width.

24. The device of claim 21 wherein:
the resistive switching material comprises a plurality of defect regions; and
the resistive switching material is selected from a group consisting of: a silicon-containing material substantially free from p-type, n-type, or metallic dopants, and a silicon-containing material substantially free from p-type, n-type or metallic impurities.

25. The device of claim 21 wherein the active metal material comprises a material selected from a group consisting of: aluminum-containing material, nickel-containing material, and platinum-containing material.

26. The device of claim 24 wherein a stack of material from the plurality of stacks of material includes a resistive switching material having a metal filament structure formed therein consisting of metal particles derived from the active metal material.

27. The device of claim 21 wherein the second plurality of wiring structures comprises a metal layer having a metal selected from a group consisting of: aluminum, aluminum alloy, copper, copper alloy, and a metallic alloy.

28. The device of claim 27 wherein the second plurality of wiring structures further comprises a barrier layer having a material selected from a group consisting of: titanium-containing material, a metal nitride, tungsten-containing material, and titanium tungsten material;
and wherein the barrier layer is in contact with the active metal material.

29. The device of claim 21 wherein the first plurality of wiring structures, the plurality of stacks of material, and the second plurality of wiring structures forms a crossbar array of resistive switching devices.

30. The device of claim 29 wherein the substrate comprises circuitry formed thereon, wherein the circuitry is selected from a group consisting of: a processor, logic, and control circuitry associated with the crossbar array of resistive switching devices.

* * * * *